United States Patent
Chang et al.

(10) Patent No.: US 11,139,017 B2
(45) Date of Patent: Oct. 5, 2021

(54) SELF-ACTIVATED BIAS GENERATOR

(71) Applicant: Taiwan Semiconductor Manufacturing Company, Ltd., Hsinchu (TW)

(72) Inventors: Yen-An Chang, Miaoli County (TW); Po-Hao Lee, Hsinchu (TW); Chia-Fu Lee, Hsinchu (TW); Yi-Chun Shih, Taipei (TW); Yu-Der Chih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/810,245

(22) Filed: Mar. 5, 2020

(65) Prior Publication Data
US 2021/0142840 A1 May 13, 2021

Related U.S. Application Data

(60) Provisional application No. 62/934,329, filed on Nov. 12, 2019.

(51) Int. Cl.
*G11C 11/16* (2006.01)
*G11C 11/4074* (2006.01)
*G11C 5/14* (2006.01)

(52) U.S. Cl.
CPC .......... *G11C 11/4074* (2013.01); *G11C 5/147* (2013.01); *G11C 11/1657* (2013.01)

(58) Field of Classification Search
CPC .. G11C 11/4074; G11C 11/1657; G11C 5/147
See application file for complete search history.

(56) References Cited

U.S. PATENT DOCUMENTS

| | | | | |
|---|---|---|---|---|
| 5,659,517 A | * | 8/1997 | Arimoto | G11C 5/14 365/226 |
| 5,805,508 A | * | 9/1998 | Tobita | G11C 11/4074 365/189.09 |
| 7,453,311 B1 | | 11/2008 | Hart et al. | |
| 8,189,396 B2 | * | 5/2012 | Chen | G11C 16/02 365/185.23 |
| 9,767,880 B1 | * | 9/2017 | Carman | G11C 11/2293 |
| 2003/0016076 A1 | * | 1/2003 | Mizuno | G11C 5/146 327/534 |
| 2005/0280463 A1 | * | 12/2005 | Chih | G05F 3/205 327/538 |
| 2006/0104131 A1 | * | 5/2006 | Sugawara | G11C 5/14 365/189.09 |
| 2008/0122527 A1 | * | 5/2008 | Okamoto | G11C 5/147 327/538 |

(Continued)

FOREIGN PATENT DOCUMENTS

TW    I326452 B    6/2010

*Primary Examiner* — Khamdan N. Alrobaie
(74) *Attorney, Agent, or Firm* — Merchant & Gould P.C.

(57) ABSTRACT

An integrated circuit device is provided. The integrated circuit device includes: a functional device including a selection device; and a bias generator circuit coupled to the selection device and configured to detect a leakage current of the functional device and generate a bias voltage based on the detected leakage current. The bias voltage is provided to the selection device to control the selection device.

20 Claims, 14 Drawing Sheets

(56) References Cited

U.S. PATENT DOCUMENTS

| | | | |
|---|---|---|---|
| 2008/0219061 A1* | 9/2008 | Choi | G11C 11/4074 |
| | | | 365/189.09 |
| 2019/0051351 A1* | 2/2019 | Pyo | G11C 11/1657 |
| 2020/0090724 A1* | 3/2020 | Antonyan | G11C 11/161 |

* cited by examiner

SELF-ACTIVATED BIAS GENERATOR

CROSS REFERENCE TO RELATED APPLICATIONS

This applications claims the benefit of U.S. Provisional Application No. 62/934,329, filed Nov. 12, 2019, and titled "Bias Generator," the disclosure of which is hereby incorporated herein by reference.

BACKGROUND

Memory devices are used to store information in semiconductor devices and systems. A nonvolatile memory device is capable of retaining data even after power is cut off. Resistive type memory devices include magnetic random access memories (MRAMs), resistive random access memories (RRAMs), and phase-change memories (PCMs). Such memory devices are subjected to Process-Voltage-Temperature (PVT) variations. To compensate for PVT variations, a constant negative bias is sometimes applied to access devices in various semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
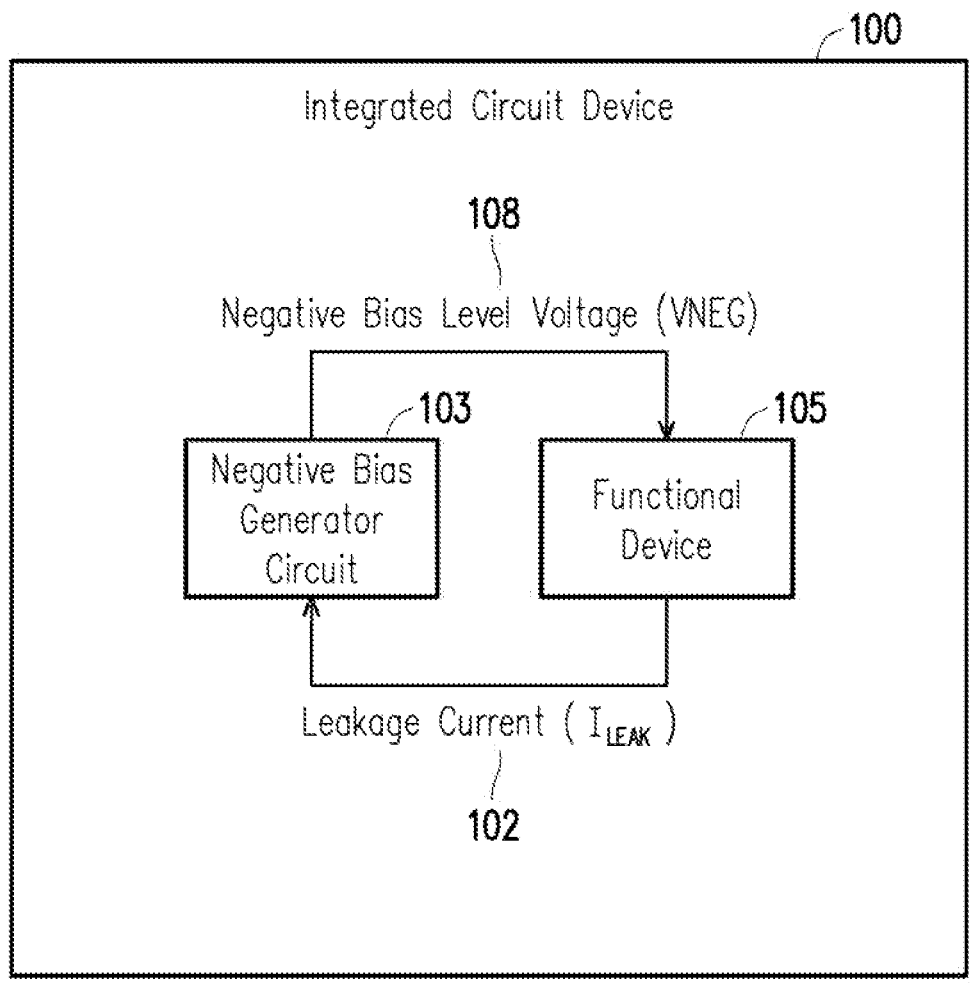
FIG. 1 is a block diagram illustrating a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, an integrated circuit device (e.g., a memory device) with a self-activated negative bias generator circuit is provided. The self-activated negative bias generator circuit detects a leakage current (i.e., off-state current) of the memory device and is selectively turned on as necessary in response to detected leakage. As such, extra power consumption at low leakage corners are avoided. On the other hand, lower leakage current results in higher current on/off ratio, thus improving access performance of the memory device.

FIG. 1 is a block diagram illustrating an integrated circuit device 100 in accordance with some embodiments. The integrated circuit device 100 includes, among other things, a negative bias generator circuit 103 and a functional device 105. A leakage current ($I_{LEAK}$) 102 of the functional device 105 is received by the negative bias generator circuit 103. The negative bias generator circuit 103 generates a negative bias level voltage (VNEG) 108 based on the leakage current 102. Specifically, when the leakage current 102 is lower than a reference current (i.e., low leakage associated with the functional device 105), the VNEG 108 is zero; when the leakage current 102 is equal to or higher than the reference current (i.e., higher leakage), the VNEG 108 is a negative voltage. As such, the self-activated negative bias generator circuit 103 detects the leakage current 102 of the functional device 105 and is selectively turned on in response to leakage associated with the functional device 105.

In some examples, the integrated circuit device 100 is a memory device that may include a plurality of memory cells, such as MRAM cells, RRAM cells, DRAM cells, etc., arranged in an array of rows and columns. Word lines connect the memory cells in a given row, while bit lines (the source lines in some examples) connect memory cells in a given column. For instance, a word line driver may be configured to output a word line selection signal to a selection device, such as an access transistor, to activate a row of memory cells.

For MRAM and other resistive type memory devices, word line swing is typically from ground to a positive bias. This may result in the memory devices not turning off well if a negative bias is used due to PVT variations. This in turn may result in the word line swing having an impact on access performance. Some conventional implementations may use a negative bias generators that constantly operates after being powered on. As a result, such conventional negative bias generators may consume extra power consumption.

In some disclosed examples, the negative bias signal VNEG 108 is selectively received by the functional device if necessary due to detected leakage. Due to its self-activation and selectiveness, the VNEG 108 may be used as word line on/off level of the memory and/or memory cell n-type selective transistor bulk bias, which will be discussed below with reference to FIGS. 4 to 5. Other usages of the VNEG 108 are within the scope of the present disclosure. Detailed structures of the negative bias generator circuit 103 and the functional device 105 will be discussed below with reference to FIG. 2.

Figure 2:
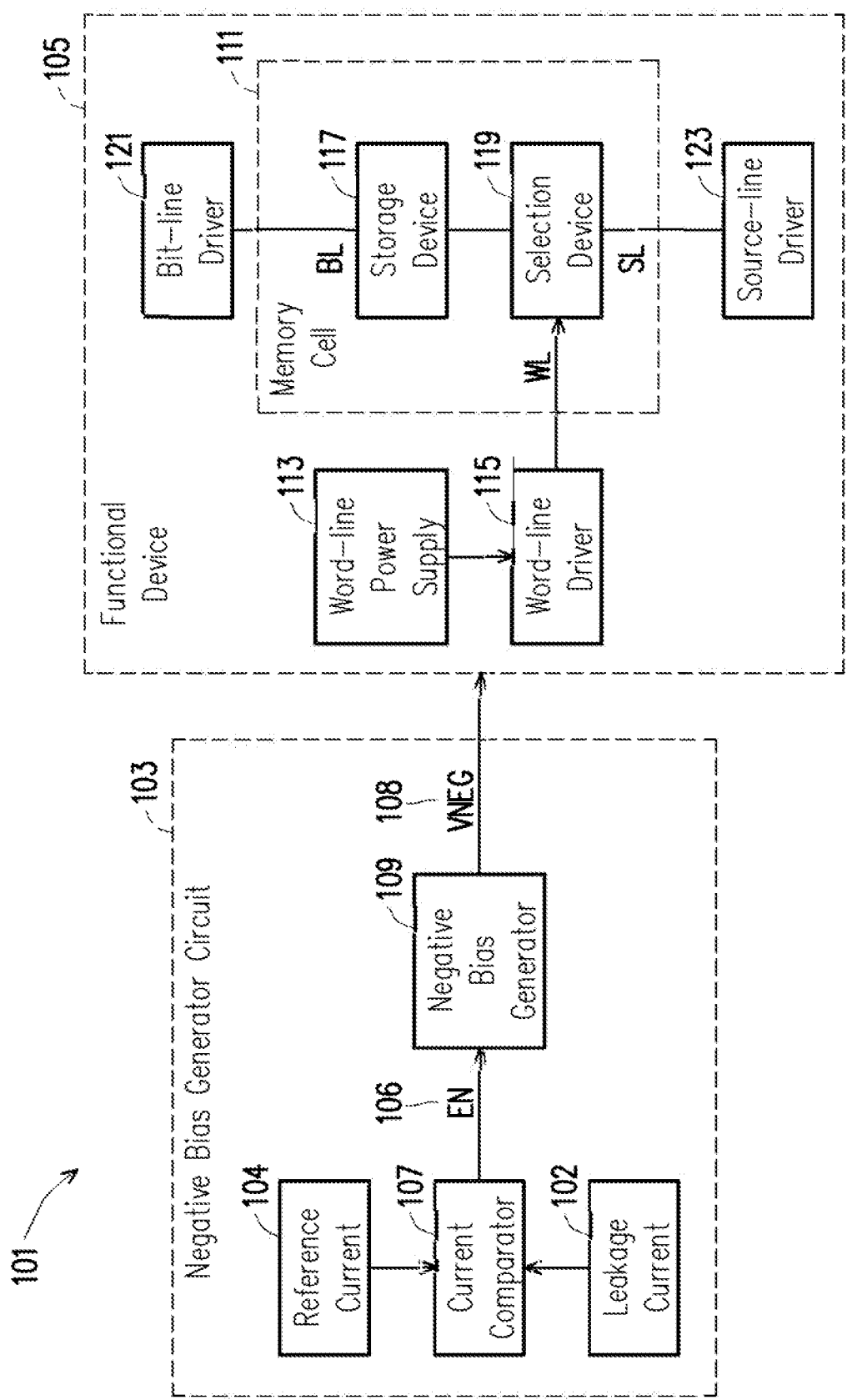
FIG. 2 is a structure diagram illustrating the memory device of FIG. 1 in accordance with some embodiments.

FIG. 2 is a structure diagram illustrating a memory device 101 in accordance with some embodiments. The negative bias generator circuit 103 includes, among other things, a current comparator 107, a negative bias generator 109, a reference current 104, and the leakage current 102 received from the functional device 105. The current comparator 107 receives both the leakage current 102 and the reference current 104. The reference current 104 is a threshold current for determining the turn on and turn off of the negative bias generator 109. In some embodiments, the reference current 104 is a predetermined value. In some embodiments, the reference current 104 is configurable. The current comparator 107 compares the leakage current 102 and the reference current 104 and outputs a negative bias generator enable signal (EN) 106 accordingly. The negative bias generator 109 receives the EN 106 and generates the VNEG 108 accordingly. As such, when the leakage current 102 is lower than the reference current 104, the VNEG 108 is zero; when the leakage current 102 is equal to or higher than the reference current 104, the VNEG 108 is a negative voltage. In some embodiments, the negative bias generator 109 may be on-chip. In some embodiments, the negative bias generator 109 may be an off-chip power supply.

On the other hand, the example functional device 105 shown in FIG. 2 includes, among other things, a memory cell 111, a word line power supply 113, a word line driver 115, a bit line driver 121, and a source line driver 123. The memory cell further includes, among other things, a storage device 117 and a selection device 119. In some embodiments, the storage device may be magneto-resistive materials for MRAMs. In some embodiments, the storage device may be resistive materials for RRAMs. In some embodiments, the storage device may be phase-change materials for PCMs. In some embodiments, the storage device may be capacitors for DRAMs.

The memory cell 111 is one example of a plurality of memory cells which form a memory cell array. For simplicity, only the memory cell 111 is shown in FIG. 2; a typical memory cell array would include many more memory cells. The plurality of memory cells may be arranged within the memory cell array in rows and/or columns. Memory cells within a row of the memory cell array are operably coupled to a word line (WL), while memory cells within a column of the memory cell array are operably coupled to a bit line (BL) and a corresponding source line (SL). In some embodiments, each column corresponds to one source line. In some embodiments, multiple columns may share a common source line (CSL). The plurality of memory cells are respectively associated with an address defined by an intersection of a word line (WL) and a bit line (BL).

As stated above, the memory cell 111 includes the storage device 117 and the selection device 119. The word line power supply provides a voltage to the word line driver 115. The word line driver 115 generates a word line signal (WL) based on a word line address. The word line signal (WL) is provided to the selection device 119. The selection device 119 is selectively turned on or turned off based on the word line signal (WL). In some embodiments, the selection device 119 is an n-type selection device. In some examples, the selection device 119 is an n-type field-effect transistor (FET). The selection device 119 is turned on when the word line signal (WL) is at logical high (i.e., "1") and turned off when the word line signal (WL) is at logical low (i.e., "0"). In some embodiments, the selection device 119 is a p-type selection device. In some examples, the selection device 119 is a p-type FET. The selection device 119 is turned on when the word line signal (WL) is at logical low and turned off when the word line signal (WL) is at logical high.

The storage device 117 is coupled to a bit line connected to the bit line driver 121. The selection device 119 is coupled to a source line connected to the source line driver 123. By activating the word line, the selection device 119 is turned on, allowing for the source line to be coupled to the storage device 117. As such, the storage device 117 is coupled between its corresponding bit line and source line when activating the word line. The storage device 117 has a resistive state that is switchable between a low resistive state and a high resistive state. The resistive states are indicative of a data value (e.g., a "1" or "0") stored within the storage device 117.

By selectively applying signals to word lines, bit lines, and source lines of the memory cell array, forming, set, reset, and read operations may be performed on the selected ones (e.g., the memory cell 111) of the plurality of memory cells. For example, in a write operation, a write current flows through the storage device 117, causing the storage device 117 to switch from the low resistive state to the high resistive state or vice versa, whereby a bit of data is written and stored in the memory cell 111. On the other hand, in a read operation, a read current flows through the storage device 117, and the read current corresponds to either the high resistive state or the low resistive state of the storage device 117. A sense amplifier (not shown) may compare the read current to a reference current to sense the bit of data stored in the memory cell 111. The sense amplifier amplifies a level of the sensed bit of data and outputs the amplified bit of data such that the bit of data stored in the memory cell 111 can be read therefrom.

Figure 3:
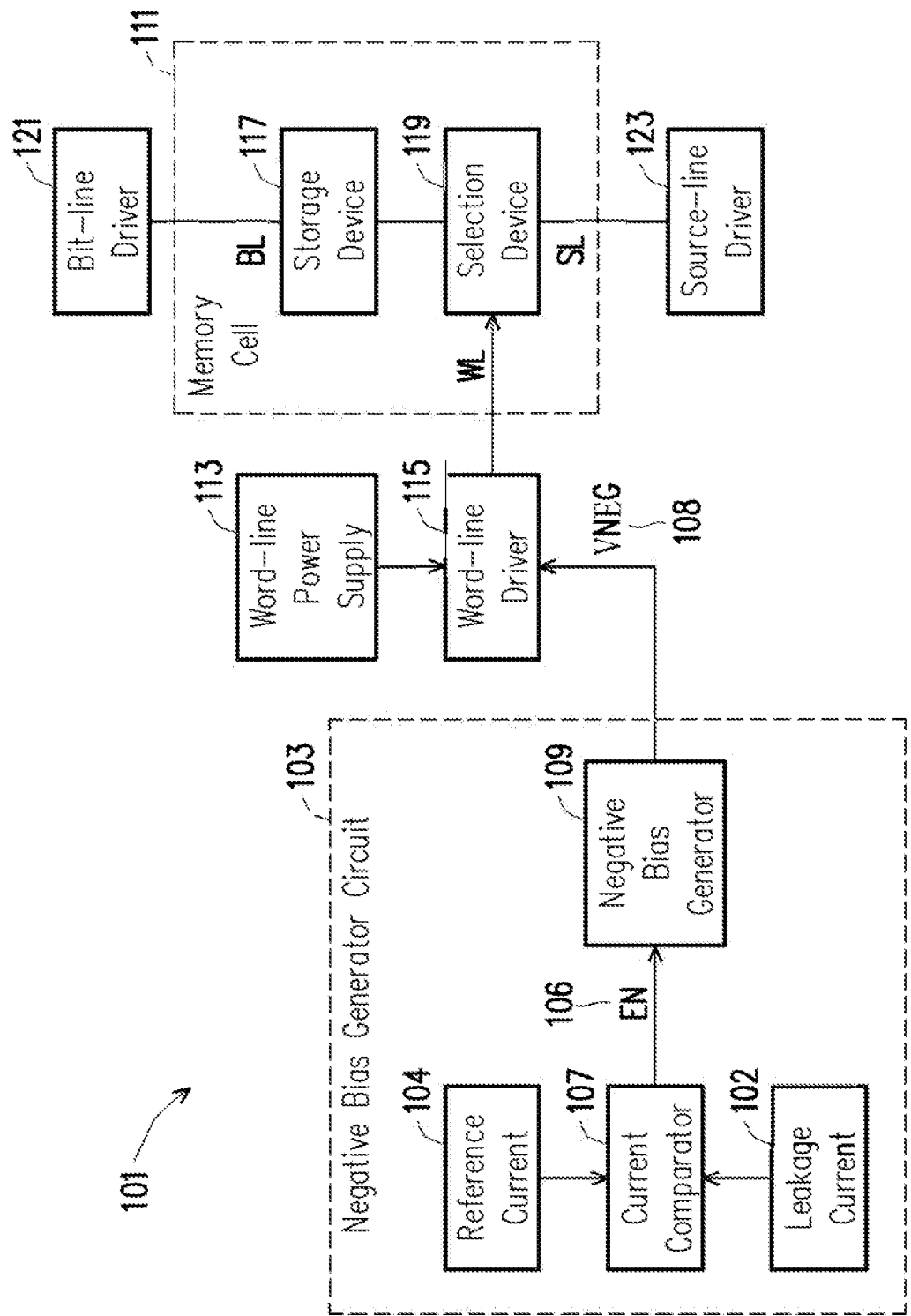
FIG. 3 is a structure diagram illustrating the memory device of FIG. 2 in accordance with some embodiments.

FIG. 3 is a structure diagram illustrating the memory device 101 of FIG. 2 in accordance with some embodiments. All the components of the memory device 101 shown in FIG. 3 are the same as those shown in FIG. 2. In the example memory device 101, the selection device 119 is an n-type selection device, the VNEG 108 is used as word line off level of the memory. Specifically, the VNEG 108 is provided to the word line driver 115.

As stated above, when the leakage current 102 is lower than the reference current 104, the VNEG 108 is zero; when the leakage current 102 is equal to or higher than the reference current 104, the VNEG 108 is a negative voltage. At the off-state of the memory cell 111, the VNEG 108 is the word line signal (WL). As a result, at the off-state of the memory cell 111, the word line signal (WL) is zero when the leakage current 102 is low and the negative voltage when the leakage current 102 is high. The negative bias generator 109 is selectively turned on as necessary in response to the leakage current 102. The negative voltage may turn off the memory cell 111 well. In the meantime, extra power consumption at low leakage corners are avoided. Lower leakage current results in higher current on/off ratio, thus improving access performance of the memory device.

Figure 4:
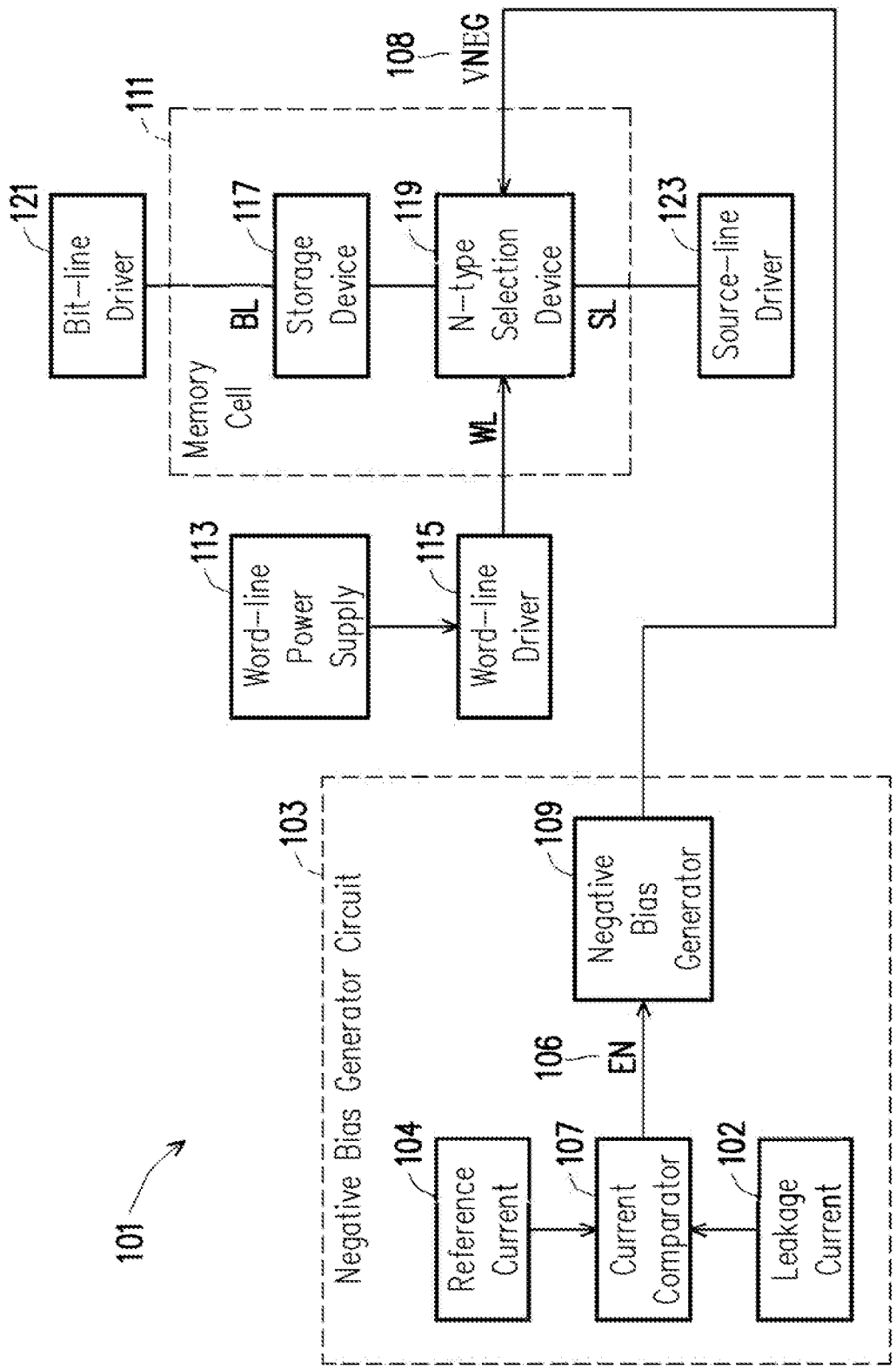
FIG. 4 is a structure diagram illustrating the memory device of FIG. 2 in accordance with some embodiments.

FIG. 4 is a structure diagram illustrating the memory device 101 of FIG. 2 in accordance with some embodiments. All the components of the memory device 101 shown in FIG. 4 are the same as those shown in FIG. 2. In the example memory device 101, the VNEG 108 is used as n-type selective transistor bulk bias. Specifically, the VNEG 108 is provided to the n-type selection device as a bulk bias.

As stated above, when the leakage current 102 is lower than the reference current 104, the VNEG 108 is zero; when the leakage current 102 is equal to or higher than the reference current 104, the VNEG 108 is a negative voltage. At the off-state of the memory cell 111, the word line signal (WL) is at logical low, and the negative voltage, as the bulk bias of the n-type selection device, may solidly turn off the memory cell. The negative bias generator 109 is selectively turned on as necessary in response to the leakage current 102. In the meantime, extra power consumption at low leakage corners are avoided. Lower leakage current results in higher current on/off ratio, thus improving access performance of the memory device.

Figure 5:
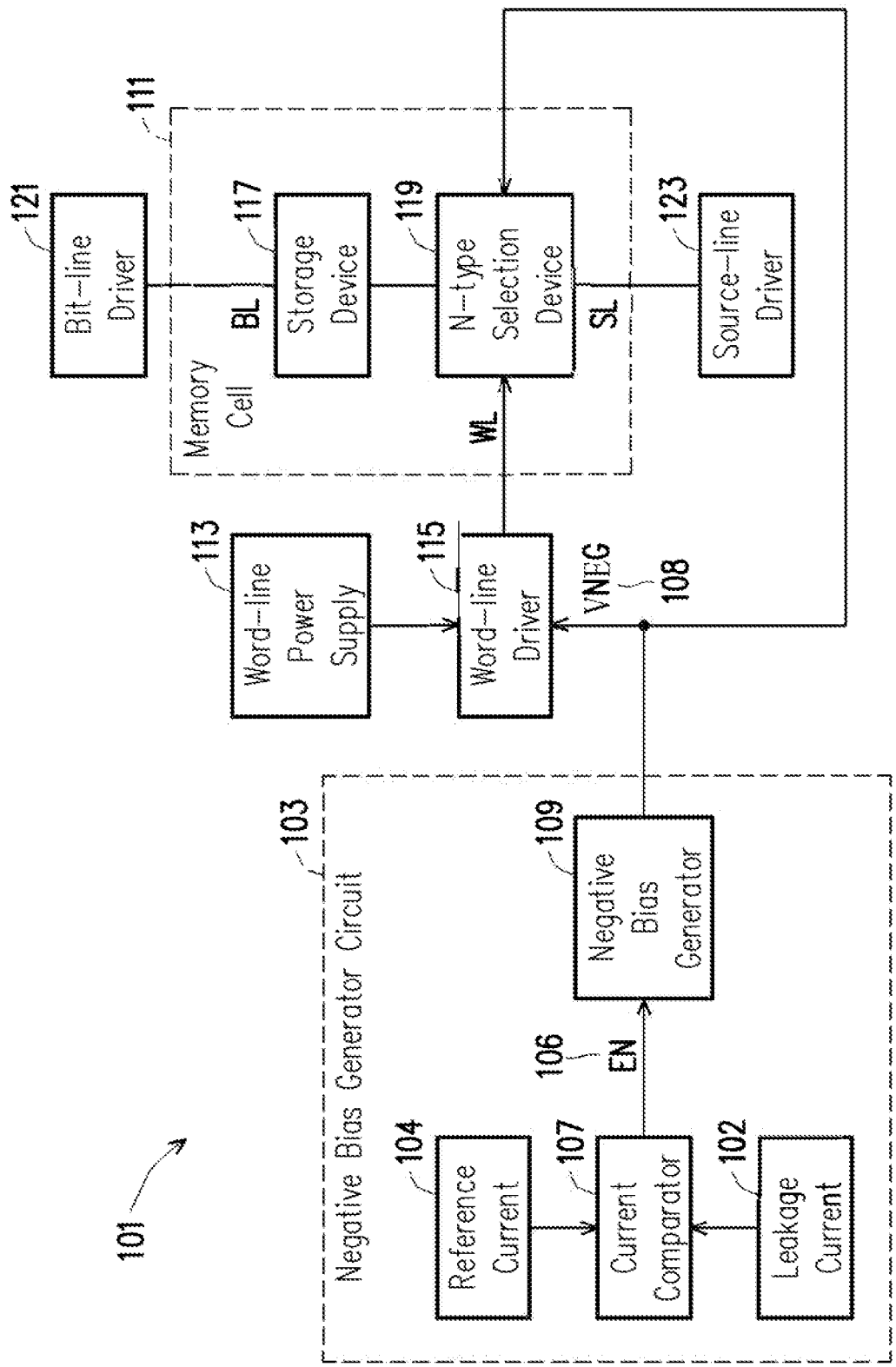
FIG. 5 is a structure diagram illustrating the memory device of FIG. 2 in accordance with some embodiments.

FIG. 5 is a structure diagram illustrating the memory device 101 of FIG. 2 in accordance with some embodiments. All the components of the memory device 101 shown in FIG. 5 are the same as those shown in FIG. 2. In the example memory device 101, the VNEG 108 is used as both word line off level of the memory and n-type selective transistor bulk bias. Specifically, the VNEG 108 is provided to both the word line driver 115 and the n-type selection device as a bulk bias.

As stated above, when the leakage current 102 is lower than the reference current 104, the VNEG 108 is zero; when the leakage current 102 is equal to or higher than the reference current 104, the VNEG 108 is a negative voltage. At the off-state of the memory cell 111, the VNEG 108 is the word line signal (WL). As a result, at the off-state of the memory cell 111, the word line signal (WL) is zero when the leakage current 102 is low and the negative voltage when the leakage current 102 is high. The negative bias generator 109 is selectively turned on as necessary in response to the leakage current 102. The negative voltage may turn off the memory cell 111 well. On the other hand, at the off-state of the memory cell 111, the word line signal (WL) is at logical low, and the negative voltage, as the bulk bias of the n-type selection device, may solidly turns off the memory cell. Again, the negative bias generator 109 is selectively turned on as necessary in response to the leakage current 102. In the meantime, extra power consumption at low leakage corners are avoided. Lower leakage current results in higher current on/off ratio, thus improving access performance of the memory device.

Figure 6:
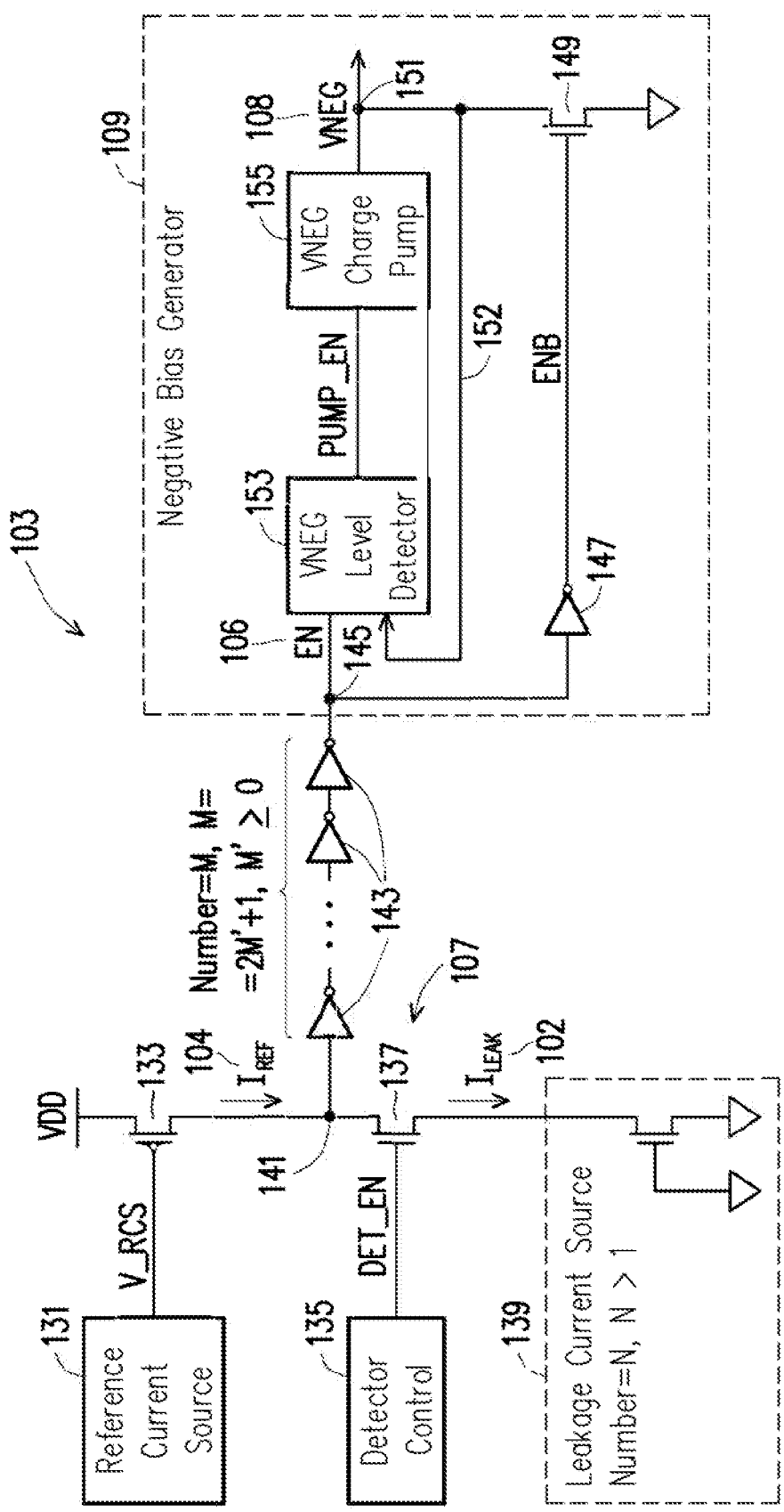
FIG. 6 is a circuit diagram illustrating the negative bias generator circuit of FIG. 1 and FIG. 2 in accordance with some embodiments.

FIG. 6 is a circuit diagram illustrating the negative bias generator circuit 103 of FIG. 1 and FIG. 2 in accordance with some embodiments. As stated above, the current comparator 107 receives both the leakage current 102 and the reference current 104 and compares the leakage current 102 and the reference current 104 to output the negative bias generator enable signal (EN) 106 accordingly. The negative bias generator 109 receives the EN 106 and generates the VNEG 108 accordingly.

Specifically, the current comparator 107 includes, among other things, a reference current source 131, a PMOS transistor 133, a detector control 135, an NMOS transistor 137, and an odd number (e.g., M and M=2M'+1 where M' is zero or a positive integer) of inverters 143. The reference current source 131 is coupled to a gate terminal of the PMOS transistor 133 and may provide a reference current source voltage V_RCS to the gate terminal of the PMOS transistor 133. When the V_RCS is at voltage supply level VDD, the PMOS transistor 133 is turned off; when the V_RCS is at analog voltage level or lower than VDD over a threshold voltage, the PMOS transistor 133 is turned on. A source terminal of the PMOS transistor 133 is coupled to a voltage supply VDD, and a drain terminal of the PMOS transistor 133 is coupled to a node 141. When the PMOS transistor 133 is turned on, the reference current 104 flows through the PMOS transistor 133 to the node 141.

The detector control 135 is coupled to a gate terminal of the NMOS transistor 137 and may provide a detection enable signal DET_EN to the gate terminal of the NMOS transistor 137. When the DET_EN is at logical high, the NMOS transistor 137 is turned on; when the DET_EN is at logical low, the NMOS transistor 137 is turned off. A drain terminal of the NMOS transistor 137 is coupled to the node 141, and a source terminal of the NMOS transistor 137 is coupled to a leakage current source 139 of the functional device 105 shown in FIG. 2. It should be noted that the leakage current source may have multiple (e.g., N and N is larger than 1) sources. When the NMOS transistor 137 is turned on, the leakage current 102 flows through the NMOS transistor 137 from the node 141.

When the leakage current 102 is lower than the reference current 104, the node 141 is at logical high. The EN 106 at a node 145 is the complement of the signal at the node 141 after the odd number of inverters 143. Thus, the EN 106 is at logical low. When the leakage current 102 is equal to or higher than the reference current 104, the node 141 is at logical low. Thus, the EN 106 is at logical high.

The negative bias generator 109 includes, among other things, a VNEG level detector 153, a VNEG charge pump 155, an inverter 147, and an NMOS transistor 149. The EN 106 is provided to the VNEG level detector 153. The VNEG level detector 153 generates a VNEG charge pump enable signal PUMP_EN based on the EN 106. The PUMP_EN is provided to the VNEG charge pump 155. The VNEG charge pump 155 output the VNEG 108 at a node 151 based on the PUMP_EN. The VNEG 108 is provided to another input of the VNEG level detector 153. On the other hand, the EN 106 is also provided to the inverter 147 and the inverter 147 outputs a bar signal of the EN 106 (i.e., an ENB). The ENB is provided to a gate terminal of the NMOS transistor 149. A drain terminal of the NMOS transistor 149 is coupled to the node 151 and a source terminal of the NMOS transistor 149 is coupled to a ground.

As stated above, when the leakage current 102 is lower than the reference current 104, the EN 106 is at logical low. As a result, the VNEG level detector 153 is deactivated, and the PUMP_EN is at logical low. Thus, the VNEG charge pump 155 is also deactivated. On the other hand, the ENB is at logical high. Therefore, the NMOS transistor 149 is turned on. Thus, the VNEG 108 at the node 151 is pulled down to the ground.

As state above, when the leakage current 102 is equal to or higher than the reference current 104, the EN 106 is at logical high. The ENB is at logical low. Therefore, the NMOS transistor 149 is turned off and the VNEG 108 at the node 151 is not pulled down to the ground. On the other hand, the VNEG level detector 153 is activated, and PUMP_EN is at logical high when VNEG 108 is shallower than a target regulated voltage level. Thus, the VNEG charge pump 155 is also activated. As such, the VNEG charge pump 155 output the VNEG 108 which is a negative voltage. In one embodiment, the VNEG charge pump 155 may include a cascade of diode/capacitor cells with a clock pulse input, and the capacitors are charged from the clock pulse input and the output is pulled down to a negative voltage. Since the VNEG 108 is provided to another input of the VNEG level detector 153 as a negative feedback, the negative bias generator 109 is regulated. In other words, the path from the node 151 to the other input of the VNEG level detector 153 is a regulation loop 152.

Figure 7A:
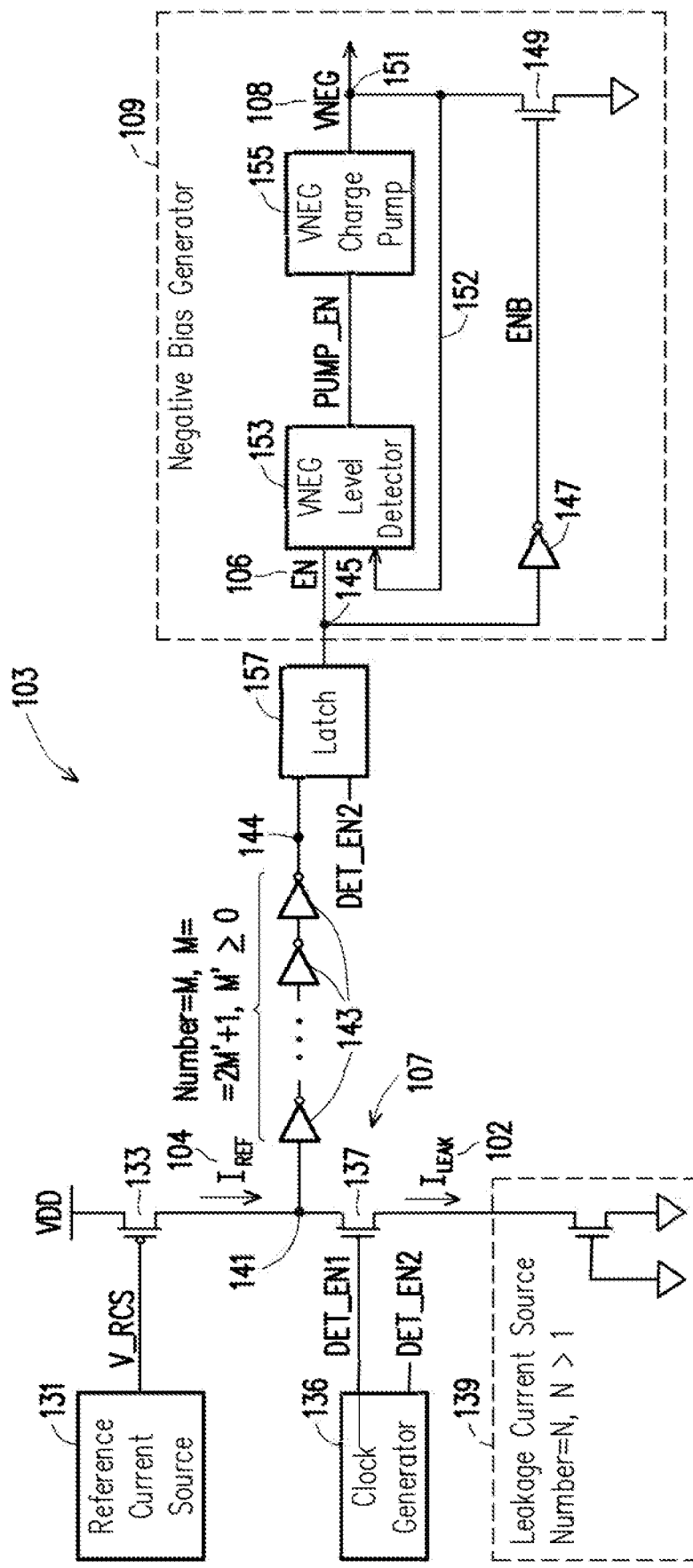
FIG. 7A is a circuit diagram illustrating the negative bias generator circuit of FIG. 1 and FIG. 2 in accordance with some embodiments.
Figure 7B:
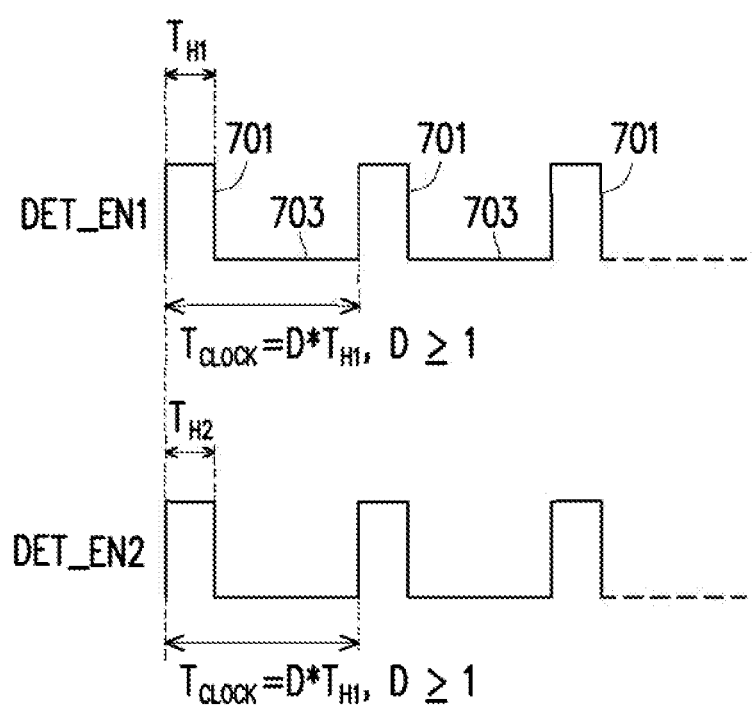
FIG. 7B is a time diagram of the negative bias generator circuit of FIG. 7A in accordance with some embodiments.

FIG. 7A is a circuit diagram illustrating the negative bias generator circuit 103 of FIG. 1 and FIG. 2 in accordance with some embodiments. FIG. 7B is a time diagram of the negative bias generator circuit 103 of FIG. 7A in accordance with some embodiments. As stated above, the current comparator 107 receives both the leakage current 102 and the reference current 104 and compares the leakage current 102 and the reference current 104 to output the negative bias generator enable signal (EN) 106 accordingly. The negative bias generator 109 receives the EN 106 and generates the VNEG 108 accordingly.

The negative bias generator circuit 103 in FIG. 7A is the same as that in FIG. 6 except three differences below. Unlike in FIG. 6, the detection enable signal DET_EN include two clock signals: a DET_EN1 and a DET_EN2. Moreover, the detector control 135 of FIG. 6 is replaced with a clock generator 136 of FIG. 7A. Additionally, the negative bias generator circuit 103 further includes a latch 157. Operations of same components are not repeated for brevity.

The clock generator 136 generates the DET_EN1 and the DET_EN2. The DET_EN1 is provided to the gate terminal of the NMOS transistor 137 to control the on and off of the NMOS transistor 137. Referring to FIG. 7A, the DET_EN1 is a periodic pulse signal with a period $T_{CLOCK}$. The pulse width is $T_{H1}$. $T_{CLOCK}$ can be calculated by the equation below, $$T_{CLOCK}=D*T_{H1},$$

where D is a duty cycle of the DET_EN1. When the DET_EN1 is at logical high (i.e., within the $T_{H1}$, "active phase" 701), the NMOS transistor 137 is turned on and the leakage current 102 is compared with the reference current 104; when the DET_EN1 is at logical low (i.e., outside the $T_{H1}$, "inactive phase" 703), the NMOS transistor 137 is turned off and the leakage current 102 is not compared with the reference current 104.

The latch 157 is coupled between a node 144 (i.e., the output of the odd number of inverters 143) and the node 145 (i.e., where the EN 106 is located). Specifically, the signal at the node 144 is input, together with the DET_EN2, to the latch 157. When the DET_EN2 is at logical low, the latch 157 latches and keeps the signal at the node 144.

Referring to FIG. 7B, the DET_EN2 is also a periodic pulse signal with the period $T_{CLOCK}$. In other words, the DET_EN2 and the DET_EN1 have the same period $T_{CLOCK}$. The pulse width is $T_{H2}$. $T_{H1}$ is equal to or larger than $T_{H2}$. As such, the latch 157 latches and keeps the signal at the node 144 no later than the transition from the active phase 701 to the inactive phase 703. In other words, the latch 157 latches and keeps the signal at the node 144 long enough.

Since the current comparator 107 compares the leakage current 102 with the reference current 104 only in the active phase 701, the DC power consumption of the current comparator 107 can be reduced. Specifically, the DC power consumption of the current comparator 107 is proportionate to ($I_{LEAK}$/D). When the duty cycle D is very large, the DC power consumption of the current comparator 107 may be significantly reduced.

Figure 8:
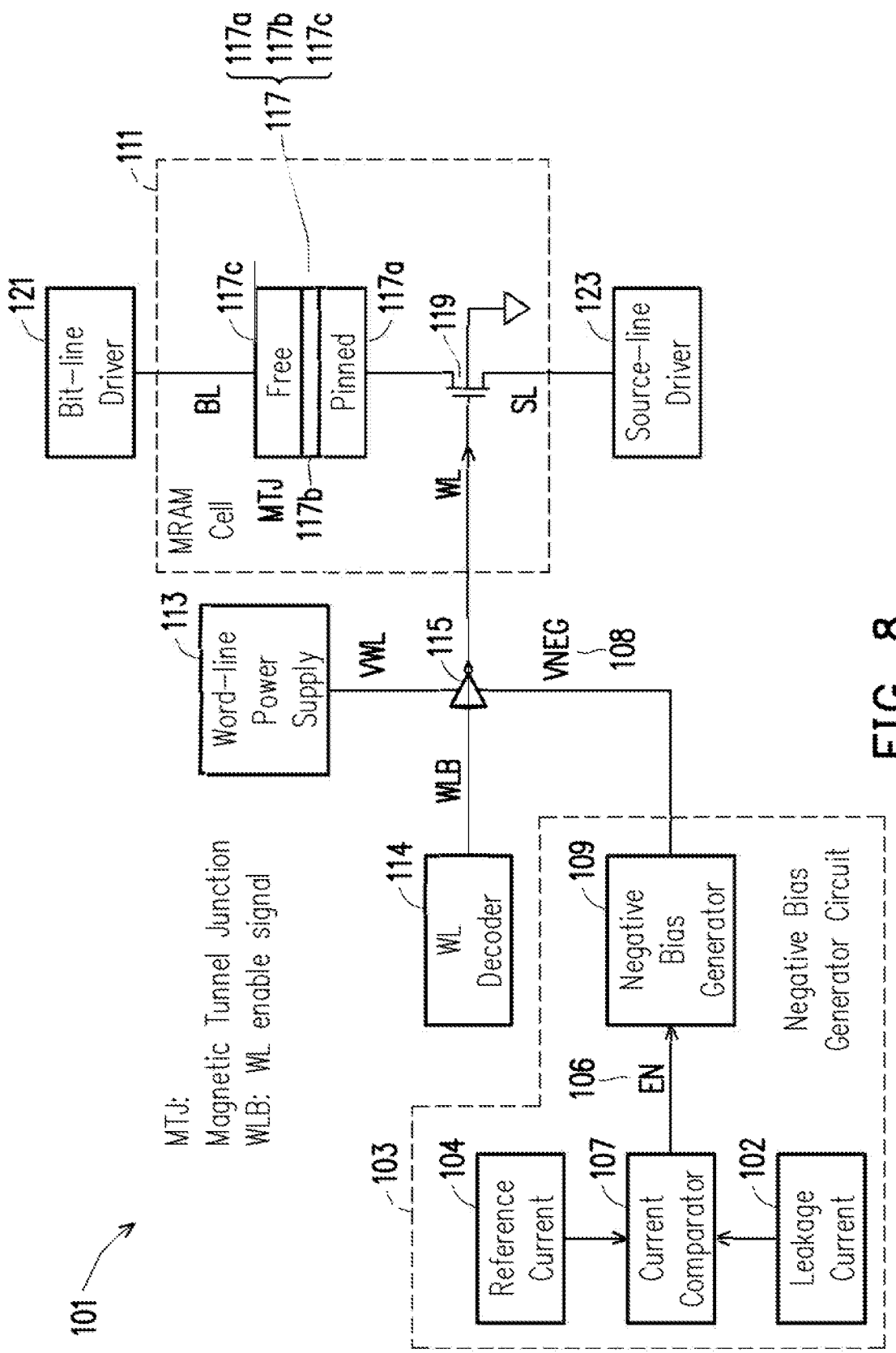
FIG. 8 is a structure diagram illustrating the memory device of FIG. 3 in accordance with some embodiments.

FIG. 8 is a structure diagram illustrating the memory device 101 of FIG. 3 in accordance with some embodiments. Like components are denoted by like numerals and will be explained in no more detail. In the example memory device 101, the VNEG 108 is used as word line off level of the memory. The storage device 117 is a magnetic tunnel junction (MTJ) 117, while the selection device 119 is an NMOS transistor 119. The word line driver 115 is an inverter 115. The MTJ 117 is one kind of MRAM. The MTJ 117 includes two superimposed layers 117a and 117c of magnetic material separated by a thin insulating film 117b. The pinned layer 117a is a magnetic layer that is permanently magnetized in a fixed magnetic field alignment direction, while the free layer 117c is a changeably-magnetized magnetic layer. The free layer 117c can be magnetized in one of two orientations relative to the pinned layer 117a. The two orientations are characterized by distinctly different serial resistances through the superimposed layers 117a and 117c of the MTJ 117. Specifically, the magnetic field orientation of the free layer 117c can be aligned the same as that of the pinned layer 117a (referred to as "parallel state") or opposite to that of the pinned layer 117a (referred to as "anti-parallel state"). The parallel alignment state has a relatively lower resistance and the anti-parallel alignment state has a relatively higher resistance.

As stated above, when the leakage current 102 is lower than the reference current 104, the VNEG 108 is zero; when the leakage current 102 is equal to or higher than the reference current 104, the VNEG 108 is a negative voltage.

A WL decoder 114 generates a word line enable signal WLB, which is input to the inverter 115. The VNEG 108 is provided to the inverter 115 as a low level bias, while a voltage VWL generated by the word line power supply 113 is provided to the inverter 115 as a high level bias. The output of the inverter 115 (i.e., the WL) has a swing from the VNEG 108 to the VWL.

When the MRAM cell 111 is at access state, the WLB is at logical low, and the output of the inverter 115 (i.e., the WL) is at logical high. In other words, the WL has a value of VWL which is higher than a threshold voltage of the NMOS transistor 119, which in turn turns on the NMOS transistor 119.

When the MRAM cell 111 is at off state, the WLB is at logical high, and the output of the inverter 115 (i.e., the WL) is at logical low. In other words, the WL has a value of the VNEG 108. As a result, at the off-state of the memory cell 111, the word line signal (WL) is zero when the leakage current 102 is low and the negative voltage when the leakage current 102 is high. The negative bias generator 109 is selectively turned on as necessary in response to the leakage current 102. The negative voltage may turn off the MRAM cell 111 well. In the meantime, extra power consumption at low leakage corners are avoided. Lower leakage current results in higher current on/off ratio, thus improving access performance of the memory device.

Figure 9:
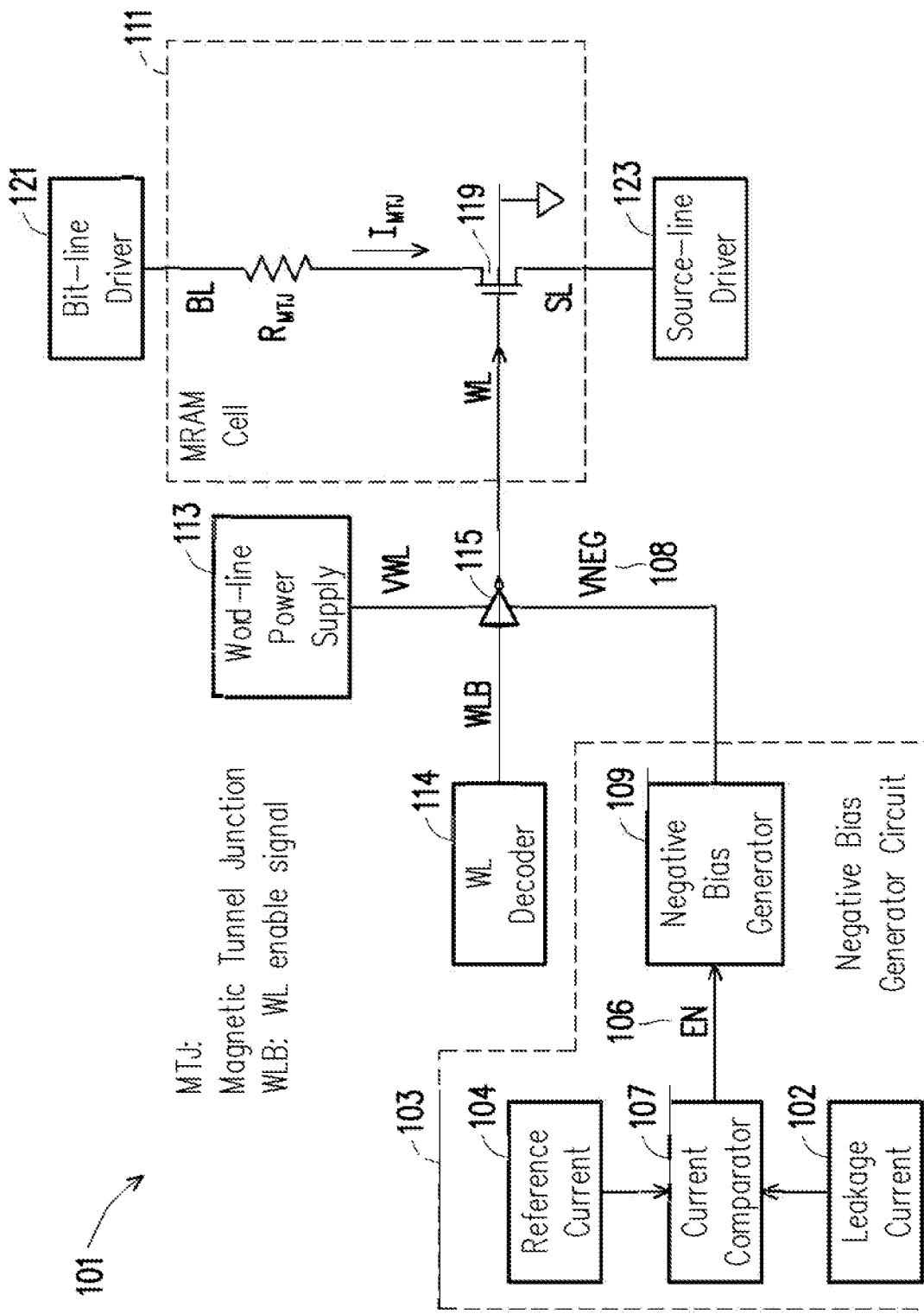
FIG. 9 is a structure diagram illustrating the memory device of FIG. 8 in accordance with some embodiments.

FIG. 9 is a structure diagram illustrating the memory device 101 of FIG. 8 in accordance with some embodiments. Like components are denoted by like numerals and will be explained in no more detail. The equivalent circuit of the MTJ 117 is represented as a resistor 117 with a resistance RMTJ. The leakage current $I_{MTJ}$ flows through the MTJ 117.

As stated above, when the MRAM cell 111 is at off state, the WLB is at logical high, and the output of the inverter 115 (i.e., the WL) is at logical low. In other words, the WL has a value of the VNEG 108. As a result, at the off-state of the memory cell 111, the word line signal (WL) is zero when the leakage current 102 is low and the negative voltage when the leakage current 102 is high. In one example, the negative voltage is −0.2V. The leakage current $I_{MTJ}$ may decrease by 1~2 orders at high temperature (e.g., 50° C., 100° C., 150° C.). On the other hand, lower leakage current $I_{MTJ}$ results in higher current on/off ratio, thus improving access performance of the memory device. In one example, the on/off ratio may increase by 1~2 orders.

Figure 10:
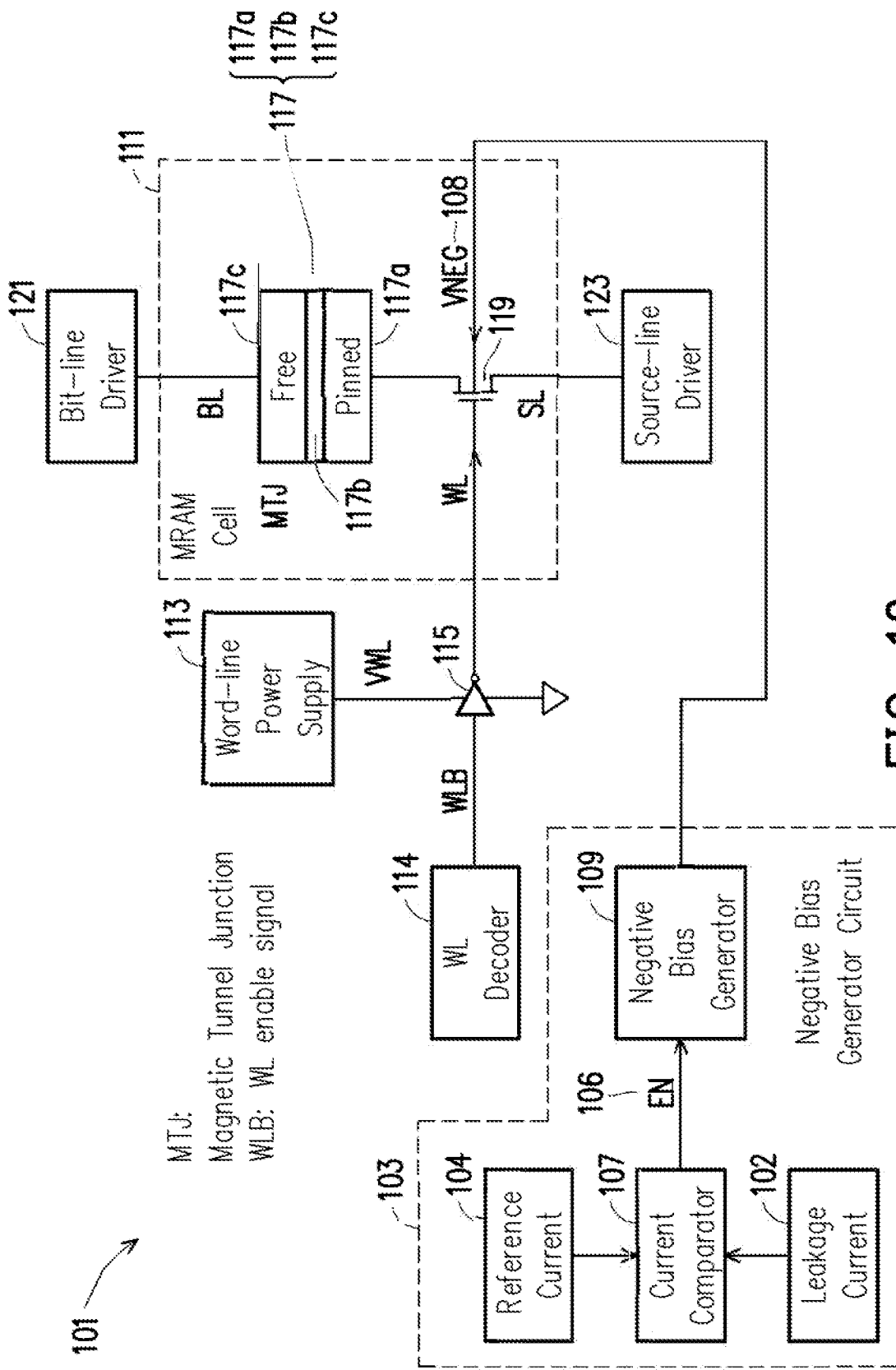
FIG. 10 is a structure diagram illustrating the memory device of FIG. 4 in accordance with some embodiments.

FIG. 10 is a structure diagram illustrating the memory device 101 of FIG. 4 in accordance with some embodiments. Like components are denoted by like numerals and will be explained in no more detail. In the example memory device 101, the VNEG 108 is used as n-type selective transistor bulk bias. Specifically, the VNEG 108 is provided to the n-type selection device as a bulk bias.

The storage device 117 is a MTJ 117, while the selection device 119 is an NMOS transistor 119. The word line driver 115 is an inverter 115. The MTJ 117 is one kind of MRAM. The MTJ 117 includes two superimposed layers 117a and 117c of magnetic material separated by a thin insulating film 117b. The pinned layer 117a is a magnetic layer that is permanently magnetized in a fixed magnetic field alignment direction, while the free layer 117c is a changeably-magnetized magnetic layer. The free layer 117c can be magnetized in one of two orientations relative to the pinned layer 117a. The two orientations are characterized by distinctly different serial resistances through the superimposed layers 117a and 117c of the MTJ 117. Specifically, the magnetic field orientation of the free layer 117c can be aligned the same as that of the pinned layer 117a (referred to as "parallel state") or opposite to that of the pinned layer 117a (referred to as "anti-parallel state"). The parallel alignment state has a relatively lower resistance and the anti-parallel alignment state has a relatively higher resistance.

As stated above, when the leakage current 102 is lower than the reference current 104, the VNEG 108 is zero; when the leakage current 102 is equal to or higher than the reference current 104, the VNEG 108 is a negative voltage.

A WL decoder 114 generates a word line enable signal WLB, which is input to the inverter 115. A ground is coupled to the inverter 115 as a low level bias, while a voltage VWL generated by the word line power supply 113 is provided to the inverter 115 as a high level bias. The output of the inverter 115 (i.e., the WL) has a swing from the ground to the VWL.

When the MRAM cell 111 is at access state, the WLB is at logical low, and the output of the inverter 115 (i.e., the WL) is at logical high. In other words, the WL has a value of VWL which is higher than a threshold voltage of the NMOS transistor 119, which in turn turns on the NMOS transistor 119.

When the MRAM cell 111 is at off state, the WLB is at logical high, and the output of the inverter 115 (i.e., the WL) is at logical low. In other words, the WL has a value of zero. The negative voltage, as the bulk bias of the n-type selection device, may solidly turns off the memory cell. The negative bias generator 109 is selectively turned on as necessary in response to the leakage current 102. In the meantime, extra power consumption at low leakage corners are avoided. Lower leakage current results in higher current on/off ratio, thus improving access performance of the memory device.

Figure 11:
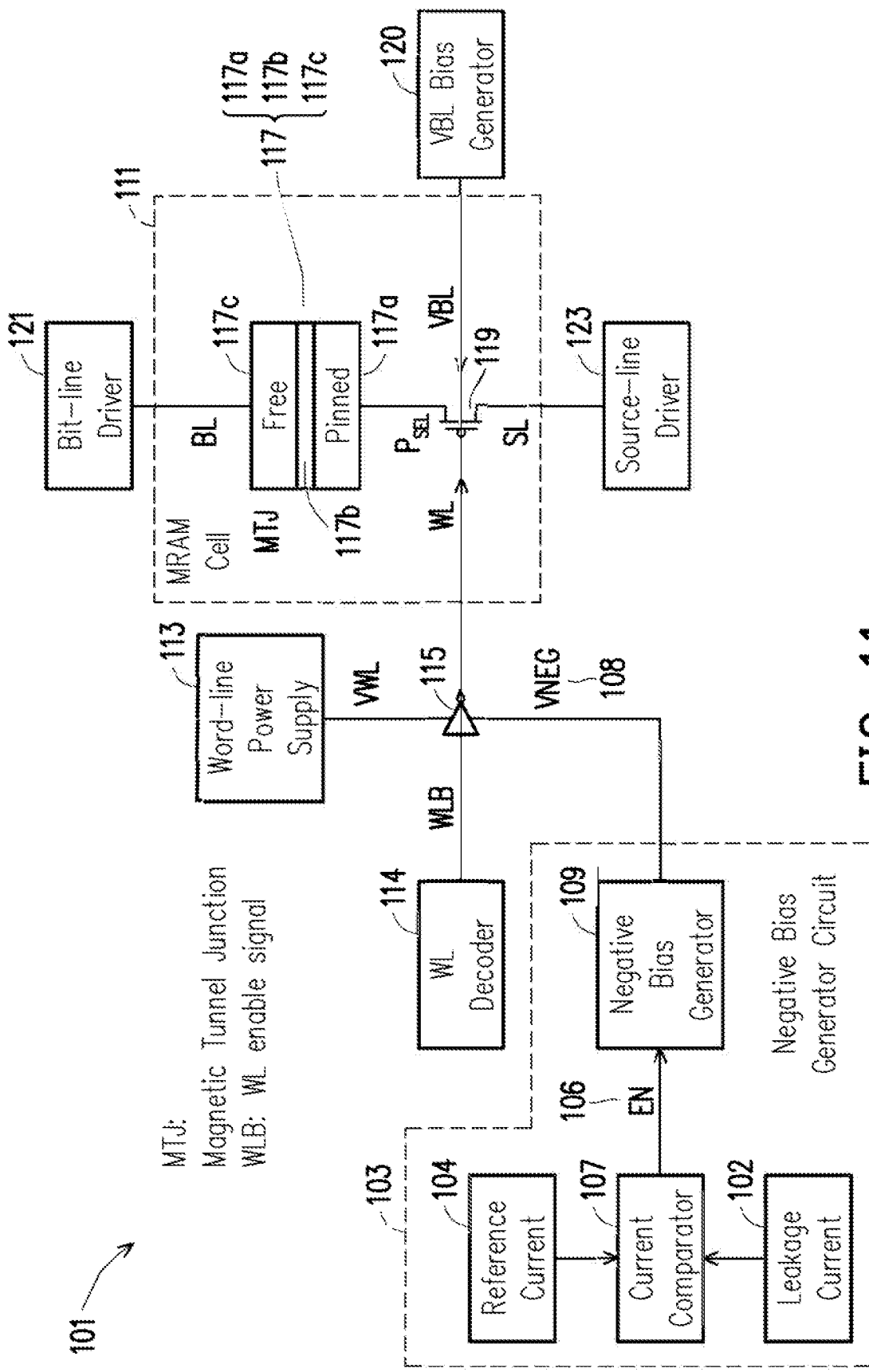
FIG. 11 is a structure diagram illustrating the memory device of FIG. 3 in accordance with some embodiments.

FIG. 11 is a structure diagram illustrating the memory device 101 of FIG. 3 in accordance with some embodiments. Like components are denoted by like numerals and will be explained in no more detail. In the example memory device 101, the VNEG 108 is used as word line on level of the memory. The storage device 117 is a MTJ 117, while the selection device 119 is a PMOS transistor 119. The word line driver 115 is an inverter 115. The MTJ 117 is one kind of MRAM. The MTJ 117 includes two superimposed layers 117a and 117c of magnetic material separated by a thin insulating film 117b. The pinned layer 117a is a magnetic layer that is permanently magnetized in a fixed magnetic field alignment direction, while the free layer 117c is a changeably-magnetized magnetic layer. The free layer 117c can be magnetized in one of two orientations relative to the pinned layer 117a. The two orientations are characterized by distinctly different serial resistances through the superimposed layers 117a and 117c of the MTJ 117. Specifically, the magnetic field orientation of the free layer 117c can be aligned the same as that of the pinned layer 117a (referred to as "parallel state") or opposite to that of the pinned layer 117a (referred to as "anti-parallel state"). The parallel alignment state has a relatively lower resistance and the anti-parallel alignment state has a relatively higher resistance.

Different from above, when the leakage current 102 is lower than the reference current 104, the VNEG 108 is a negative voltage; when the leakage current 102 is equal to or higher than the reference current 104, the VNEG 108 is zero.

A WL decoder 114 generates a word line enable signal WLB, which is input to the inverter 115. The VNEG 108 is provided to the inverter 115 as a low level bias, while a voltage VWL generated by the word line power supply 113 is provided to the inverter 115 as a high level bias. The output of the inverter 115 (i.e., the WL) has a swing from the VNEG 108 to the VWL.

When the MRAM cell 111 is at off state, the WLB is at logical low, and the output of the inverter 115 (i.e., the WL) is at logical high. In other words, the WL has a value of VWL which is higher than a threshold voltage of the PMOS transistor 119, which in turn turns off the NMOS transistor 119.

When the MRAM cell 111 is at access state, the WLB is at logical high, and the output of the inverter 115 (i.e., the WL) is at logical low. In other words, the WL has a value of the VNEG 108. As a result, at the access state of the memory cell 111, the word line signal (WL) is zero at fast corners (i.e., associated with high carrier mobility) and the negative voltage at slow corners (i.e., associated with low carrier mobility). The negative bias generator 109 is selectively turned on only at slow corners. The negative voltage at slow corners may turn on the MRAM cell 111 well. In the meantime, extra power consumption at fast corners are avoided. Lower leakage current results in higher current on/off ratio, thus improving access performance of the memory device.

Figure 12:
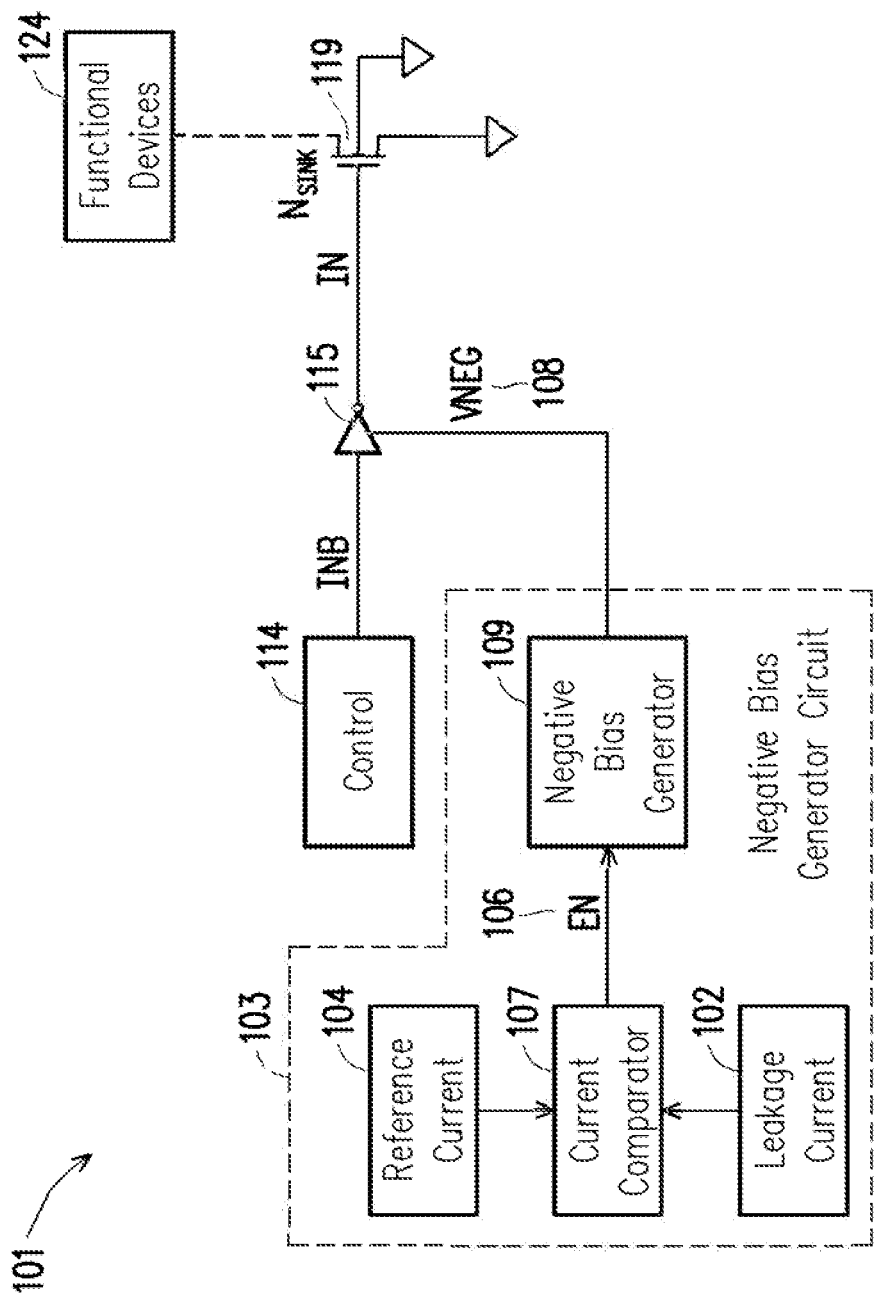
FIG. 12 is a structure diagram illustrating the memory device of FIG. 1 in accordance with some embodiments.

FIG. 12 is a structure diagram illustrating a semiconductor device 101, in accordance with some embodiments. Like components are denoted by like numerals and will be explained in no more detail. In the example device 101, the VNEG 108 is used as NMOS logic gate turn off bias level.

The VNEG 108 is provided to an inverter 115 as a bias. A control 114 generates a control signal INB, which is input to the inverter 115. The output IN of the inverter 115 is provided to a gate terminal of an NMOS transistor 119. A drain terminal and a bulk terminal of the NMOS transistor 119 are both coupled to a ground. A source terminal of the NMOS transistor 119 is coupled to functional devices 124.

As stated above, when the leakage current 102 is lower than the reference current 104, the VNEG 108 is zero; when the leakage current 102 is equal to or higher than the reference current 104, the VNEG 108 is a negative voltage.

When the INB is at logical high, the IN is at logical low and the NMOS transistor 119 is turned off. In other words, the IN has a value of the VNEG 108. As a result, the turn off bias level of the NMOS transistor 119 is zero when the leakage current 102 is low and is the negative voltage when the leakage current 102 is high. The negative bias generator 109 is selectively turned on as necessary in response to the leakage current 102. The negative voltage may turn off the NMOS transistor 119 well. In the meantime, extra power consumption at low leakage corners are avoided. It would effectively reduce off-state current of logic devices.

Figure 13:
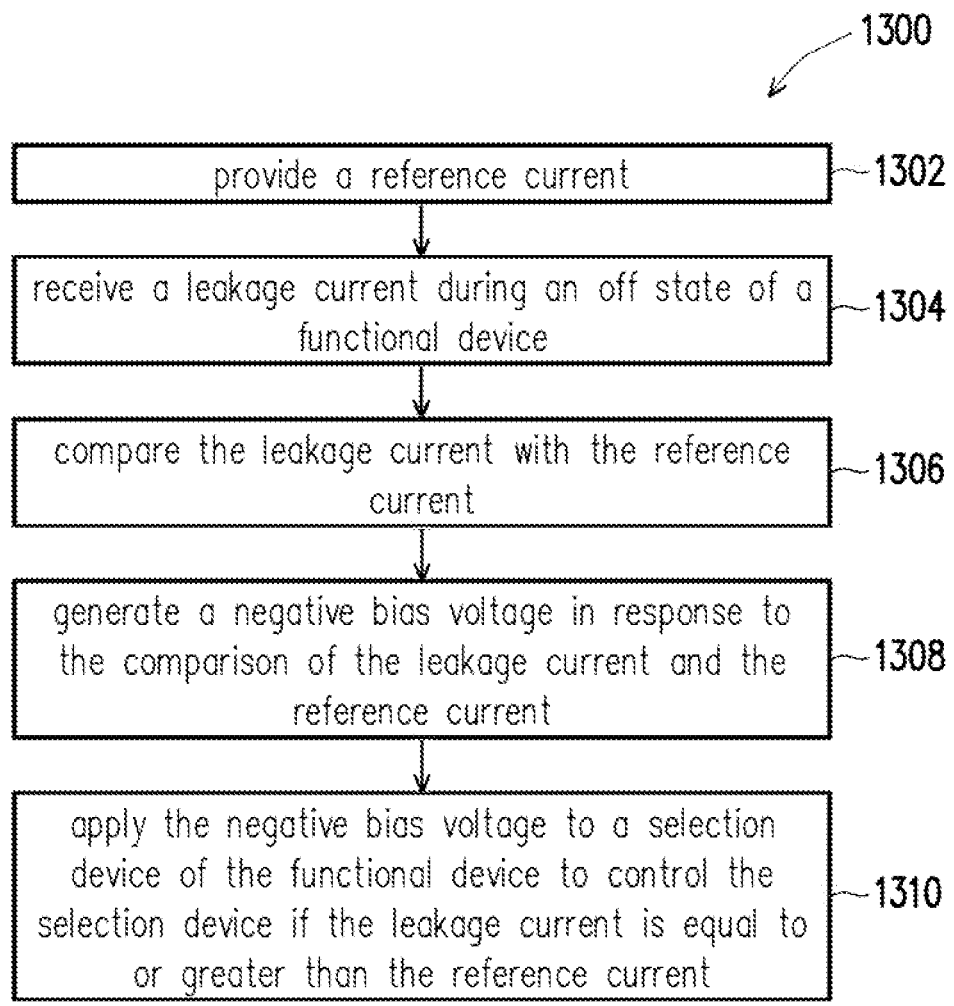
FIG. 13 is a flow diagram illustrating an example of a method for operating a memory device in accordance with some embodiments.

FIG. 13 is a flow diagram illustrating an example of a method 1300 for operating an integrated circuit device, such as the example memory device 101 shown in FIG. 2, in accordance with some embodiments. It should be noted that the example method 1300 is also applicable to other devices or structures. At step 1302, a reference current 104 is provided. At step 1304, a leakage current 102 during an off state of a functional device 105 is received. At step 1306, the leakage current is compared with the reference current. At step 1308, a negative bias voltage is generated in response to the comparison of the leakage current and the reference current. At step 1310, the negative bias voltage is applied to a selection device 119 of the functional device 105 to control the selection device 119 if the leakage current is equal to or greater than the reference current.

In accordance with some disclosed embodiments, an integrated circuit device is provided. The integrated circuit device includes: a functional device including a selection device; and a bias generator circuit coupled to the selection device and configured to detect a leakage current of the functional device and generate a bias voltage based on the detected leakage current. The bias voltage is provided to the selection device to control the selection device.

In accordance with some disclosed embodiments, a bias generator circuit is provided. The bias generator circuit includes: a current comparator configured to compare a leakage current of a functional device with a reference current to generate a comparison result; and a bias generator coupled to the current comparator and configured to output a bias voltage to a selection device of the functional device. The bias voltage is output based on the comparison result.

In accordance with further disclosed embodiments, a method for operating an integrated circuit device is provided. The method includes: providing a reference current; receiving a leakage current during an off state of a functional device; comparing the leakage current with the reference current; generating a negative bias voltage in response to the comparison of the leakage current and the reference current; and applying the negative bias voltage to a selection device of the functional device to control the selection device if the leakage current is equal to or greater than the reference current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
 a functional device including a selection device connected to a word line; and
 a bias generator circuit coupled to the functional device and configured to detect a leakage current of the functional device and generate a bias voltage based on the detected leakage current;
 wherein the bias voltage is provided to the word line connected to the selection device to control the selection device.

2. The integrated circuit device of claim 1, wherein the bias voltage is zero when the leakage current is less than a reference current, and the bias voltage is a negative voltage when the leakage current is equal to or greater than the reference current.

3. The integrated circuit device of claim 1, wherein the bias voltage is a negative voltage when the leakage current is less than a reference current, and the bias voltage is zero when the leakage current is equal to or greater than the reference current.

4. The integrated circuit device of claim 2, wherein the bias generator circuit comprises:
 a current comparator configured to compare the leakage current with the reference current and generate a first signal; and
 negative charge pump coupled to the current comparator and configured to receive the first signal and generate the bias voltage based on the first signal.

5. The integrated circuit device of claim 4, wherein the negative charge pump is configured to output a negative voltage if the leakage current is greater than the reference current.

6. The integrated circuit device of claim 2, wherein the bias generator circuit further comprises:
 a clock signal generator configured to generate a clock signal, wherein the current comparator is configured to compare the leakage current with the reference current in response to the clock signal.

7. The integrated circuit device of claim 6, wherein the bias generator circuit further comprises:
 a latch coupled between the current comparator and the bias generator and configured to latch the first signal in response to the clock signal.

8. The integrated circuit device of claim 5, wherein the integrated circuit device further comprising a word line driver configured to receive the bias voltage from the negative charge pump and output a word line signal to the selection device, wherein the word line signal is the negative voltage if the leakage current is greater than the reference current.

9. The integrated circuit device of claim 8, wherein the selection device includes a selection transistor having a gate terminal configured to receive the word line signal.

10. The integrated circuit device of claim 9, wherein the selection transistor is configured to receive the bias voltage as a bulk bias voltage.

11. The integrated circuit device of claim 9, wherein the selection device is an NMOS transistor.

12. A bias generator circuit, comprising:
 a current comparator configured to compare a leakage current of a functional device with a reference current to generate a comparison result, the functional device including a selection device connected to a word line; and a bias generator coupled to the current comparator and configured to output a bias voltage to the word line connected to the selection device of the functional device;

wherein the bias voltage is output based on the comparison result.

13. The bias generator circuit of claim 12, wherein the bias voltage is zero when the leakage current is less than a reference current, and the bias voltage is a negative voltage when the leakage current is equal to or greater than the reference current.

14. The bias generator circuit of claim 13, wherein the current comparator compares the leakage current with the reference current in response to a first enable signal.

15. The bias generator circuit of claim 13, wherein the bias generator circuit further comprises:

a clock signal generator configured to generate a first clock signal, wherein the first clock signal has an active phase and an inactive phase, and the current comparator compares the leakage current with the reference current in the active phase, and does not compare the leakage current with the reference current in the inactive phase.

16. The bias generator circuit of claim 13, where in the bias generator circuit further comprises:

a latch coupled between the current comparator and the bias generator and configured to latch the comparison result during a first period, wherein the active phase is within the first period.

17. The bias generator circuit of claim 14, wherein the bias generator comprises:

a first transistor coupled between a ground terminal and an output node of the bias generator and having a gate terminal connected to the enable signal.

18. A method, comprising:

providing a reference current;

receiving a leakage current during an off state of a functional device, the functional device including a selection device connected to a word line;

comparing the leakage current with the reference current;

generating a negative bias voltage in response to the comparison of the leakage current and the reference current; and applying the negative bias voltage to the word line of the selection device of the functional device to control the selection device if the leakage current is greater than the reference current.

19. The method of claim 18, wherein the selection device includes a selection transistor, the method further comprising applying the negative bias voltage to a gate terminal of the selection transistor if the leakage current is greater than the reference current.

20. The method of claim 19, further comprising applying the negative bias voltage to the selection transistor as a negative bulk bias.

* * * * *